US012666833B2

(12) United States Patent
Yan et al.

(10) Patent No.: US 12,666,833 B2
(45) Date of Patent: Jun. 23, 2026

(54) DISPLAY BACKPLANE, METHOD FOR MANUFACTURING THE SAME AND DISPLAY DEVICE

(71) Applicants: Hefei Xinsheng Optoelectronics Technology Co., Ltd., Hefei (CN); BOE Technology Group Co., Ltd., Beijing (CN)

(72) Inventors: Liangchen Yan, Beijing (CN); Jun Geng, Beijing (CN); Tongshang Su, Beijing (CN); Wei He, Beijing (CN); Bin Zhou, Beijing (CN)

(73) Assignees: Hefei Xinsheng Optoelectronics Technology Co., Ltd., Hefei (CN); BOE Technology Group Co., Ltd., Beijing (CN)

( * ) Notice: Subject to any disclaimer, the term of this patent is extended or adjusted under 35 U.S.C. 154(b) by 1252 days.

(21) Appl. No.: 17/483,504

(22) Filed: Sep. 23, 2021

(65) Prior Publication Data

US 2022/0093723 A1 Mar. 24, 2022

(30) Foreign Application Priority Data

Sep. 23, 2020 (CN) .......................... 202011011250.7

(51) Int. Cl.
*G02F 1/1362* (2006.01)
*H10K 59/176* (2023.01)
*H10K 59/12* (2023.01)

(52) U.S. Cl.
CPC ..... *H10K 59/176* (2023.02); *G02F 1/136227* (2013.01); *H10K 59/1201* (2023.02)

(58) Field of Classification Search
CPC .. H10K 59/123; H10K 59/124; H10K 59/176; H10K 59/1201; G02F 1/136227
See application file for complete search history.

(56) References Cited

U.S. PATENT DOCUMENTS

2008/0315756 A1* 12/2008 Jeon ...................... H10K 59/122
445/24
2013/0256678 A1* 10/2013 Nishikawa ........... H10D 86/441
257/72

(Continued)

FOREIGN PATENT DOCUMENTS

CN 109904211 * 6/2019 ............. H01L 21/77
CN 109904211 A 6/2019
CN 111524957 A 8/2020

OTHER PUBLICATIONS

CN 202011011250.7 first office action.

*Primary Examiner* — Eric K Ashbahian
(74) *Attorney, Agent, or Firm* — IPro, PLLC

(57) ABSTRACT

A display backplane, a manufacturing method thereof, and a display device are provided. The display backplane includes a base substrate. A thin film transistor array layer, a protective layer, a planarization layer, and a light-emitting element are arranged on the base substrate. A first through hole is formed in the protective layer, and a second through hole is formed in the planarization layer. The first through hole and the second through hole are connected. A source electrode or a drain electrode is electrically connected to an anode via the first through hole and the second through hole. Each of the first through hole and the second through hole has a sidewall inclined relative to the base substrate.

15 Claims, 8 Drawing Sheets

(56)  References Cited

U.S. PATENT DOCUMENTS

2014/0252365 A1*  9/2014  Shinokawa .......... H10K 59/124
                                                  257/72
2015/0123113 A1*  5/2015  Park .................... H10D 86/021
                                                  438/668
2016/0079287 A1*  3/2016  Yan ..................... H10D 86/021
                                                  438/689
2019/0302551 A1*  10/2019  Cao ..................... H10D 86/443
2019/0361279 A1*  11/2019  Yi ..................... G02F 1/136227
2021/0233982 A1*  7/2021  Yuan ................... H10K 71/166
2022/0013583 A1*  1/2022  Takahashi ............ H10K 59/131

* cited by examiner

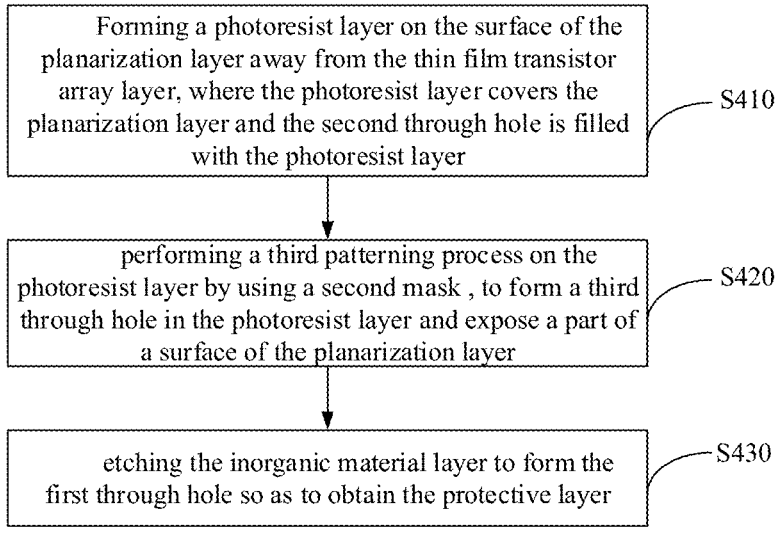

| | |
|---|---|
| Forming a photoresist layer on the surface of the planarization layer away from the thin film transistor array layer, where the photoresist layer covers the planarization layer and the second through hole is filled with the photoresist layer | S410 |
| performing a third patterning process on the photoresist layer by using a second mask , to form a third through hole in the photoresist layer and expose a part of a surface of the planarization layer | S420 |
| etching the inorganic material layer to form the first through hole so as to obtain the protective layer | S430 |

FIG. 8

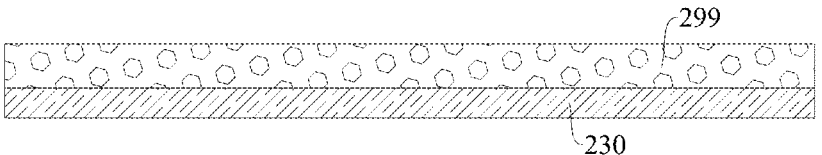

FIG. 9a

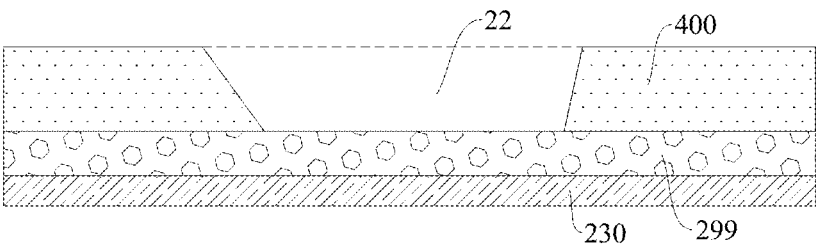

DISPLAY BACKPLANE, METHOD FOR MANUFACTURING THE SAME AND DISPLAY DEVICE

CROSS-REFERENCE TO RELATED APPLICATIONS

This application claims a priority to Chinese Patent Application No. 202011011250.7 filed in China on Sep. 23, 2020, which is incorporated in its entirety by reference herein.

TECHNICAL FIELD

The present disclosure relates to the field of display technology, and in particular to a display backplane, a method for manufacturing the display backplane and a display device.

BACKGROUND

Organic light-emitting diode (OLED) display devices are thin-film light-emitting devices made of organic semiconductor materials, which have a characteristic of self-illumination. Top-emission OLED display devices have advantages such as large aperture ratio and high resolution, and thus have attracted extensive attention from people.

SUMMARY

In an aspect of the present disclosure, a display backplane is provided. According to embodiments of the present disclosure, the display backplane includes a base substrate, where a thin film transistor array layer, a protective layer, a planarization layer, and a light-emitting element are laminated one on another in sequence on the base substrate. A first through hole is formed in the protective layer, a second through hole is formed in the planarization layer, and the first through hole and the second through hole are connected. A source electrode or a drain electrode of the thin film transistor array layer is electrically connected to an anode of the light-emitting element via the first through hole and the second through hole. Each of the first through hole and the second through hole includes a sidewall that is inclined with respect to the base substrate.

According to embodiments of the present disclosure, an orthographic projection of the first through hole onto the base substrate is a first orthographic projection, an orthographic projection of the second through hole onto the base substrate is a second orthographic projection, the second orthographic projection covers the first orthographic projection, an area of the second orthographic projection is larger than an area of the first orthographic projection, and a contour line of the second orthographic projection partially overlaps a contour line of the first orthographic projection.

According to embodiments of the present disclosure, an area of a cross-section of the first through hole near the base substrate is smaller than an area of a cross-section of the first through hole near the planarization layer.

According to embodiments of the present disclosure, areas of cross-sections of the first through hole gradually decrease in a direction approaching the base substrate.

According to embodiments of the present disclosure, an acute angle, between the sidewall of the first through hole that is inclined with respect to the base substrate and a plane where the base substrate is located, ranges from 40° to 60°.

According to embodiments of the present disclosure, the display backplane further includes a data line connected with the source electrode or the drain electrode, each of the contour lines of the first orthographic projection and the second orthographic projection is a polygon, and a part where the contour lines of the first orthographic projection and the second orthographic projection are overlapped is an edge of the polygon. An extension direction of the part where the contour lines are overlapped is the same as an extension direction of the data line, or, an extension direction of the part where the contour lines are overlapped is perpendicular to an extension direction of the data line.

According to embodiments of the present disclosure, the sidewall of the second through hole that is inclined with respect to the base substrate has a step-like structure.

According to embodiments of the present disclosure, the step-like structure includes a first sidewall and a second sidewall, and the first sidewall and the sidewall of the first through hole that is inclined with respect to the base substrate are coplanar.

In another aspect of the present disclosure, a method for manufacturing the display backplane described above is provided. According to embodiments of the present disclosure, the method includes: forming the thin film transistor array layer on a surface of the base substrate; forming an inorganic material layer on a surface of the thin film transistor array layer away from the base substrate; forming the planarization layer with the second through hole, on a surface of the inorganic material layer away from the thin film transistor array layer; performing a first patterning process on the inorganic material layer at the second through hole to form the first through hole, and obtaining the protective layer; and forming the light-emitting element on surfaces of the planarization layer and the thin film transistor array layer away from the base substrate, to obtain the display backplane.

According to embodiments of the present disclosure, the forming the planarization layer with the second through hole on the surface of the inorganic material layer away from the thin film transistor array layer includes: forming a first photoresist layer on the surface of the inorganic material layer away from the thin film transistor array layer; and performing a second patterning process on the first photoresist layer by using a first mask, to obtain the planarization layer with the second through hole. The performing the first patterning process on the inorganic material layer at the second through hole to form the first through hole includes: forming a second photoresist layer on the surface of the planarization layer away from the thin film transistor array layer, where the second photoresist layer covers the planarization layer and the second through hole is filled with the second photoresist layer; performing a third patterning process on the second photoresist layer by using a second mask, to form a third through hole in the second photoresist layer and expose a part of a surface of the planarization layer; and etching the inorganic material layer to form the first through hole so as to obtain the protective layer.

According to embodiments of the present disclosure, a part of an orthographic projection of a second opening in the second mask onto the base substrate is outside an orthographic projection of a first opening in the first mask onto the base substrate; a distance, from an edge of the orthographic projection of the second opening onto the base substrate, to an edge of the orthographic projection of the first opening onto the base substrate, ranges from 1.5μm to 2.0 μm, where the edge of the orthographic projection of the second opening is outside the orthographic projection of the first opening.

According to embodiments of the present disclosure, the method further includes etching the exposed planarization layer to form a step-like structure at the second through hole of the planarization layer.

According to embodiments of the present disclosure, a process for etching the inorganic material layer includes dry etching.

In yet another aspect of the present disclosure, a display device is provided, including the display backplane described above.

BRIEF DESCRIPTION OF THE DRAWINGS

FIG. 1b shows a partial enlarged view of the display backplane in FIG. 1a;

FIG. 8 shows a flow chart of steps of forming a protective layer according to an embodiments of the present disclosure;

FIG. 9a, FIG. 9b, FIG. 9c, FIG. 9d, FIG. 9e and FIG. 9f show a flow chart of a method for manufacturing a display backplane according to another embodiment of the present disclosure;

DETAILED DESCRIPTION

Embodiments of the present disclosure are described in detail hereinafter. The embodiments described hereinafter are illustrative, which are used to explain the present disclosure, and should not be construed as limiting the present disclosure. For techniques or conditions that are not specifically indicated in the embodiments, the procedures may be carried out in accordance with the techniques or conditions described in the literature in the art or in accordance with product specifications.

OLED display devices have gradually increasing sizes. Correspondingly, thicknesses of a gate electrode and a source or drain electrode of a thin film transistor in a display backplane may also increase. As a result, a thickness of a planarization layer (whose material is usually resin) needs to be relatively large, when the planarization layer is utilized for planarizing.

Figure 1A:
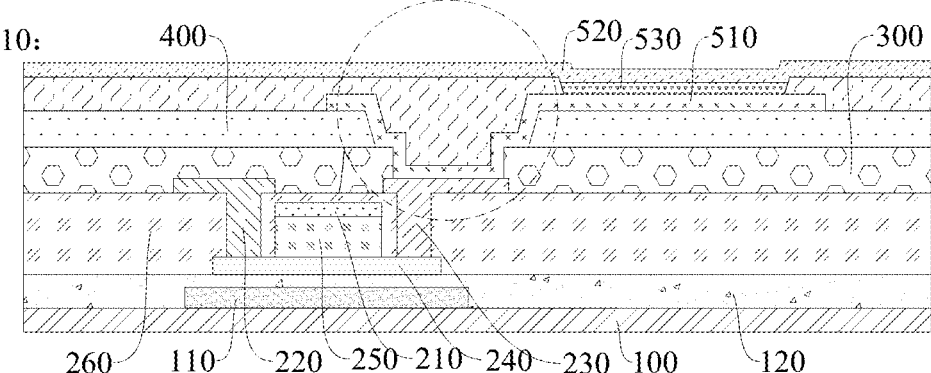
FIG. 1a shows a sectional view of a display backplane in the related technologies.

Specifically, referring to FIG. 1a, a display backplane 10 includes a base substrate 100, a light shielding layer 110, a buffer layer 120, and a thin film transistor array layer (a person skilled in the art can understand that this layer includes structures of a conventional thin film transistor array layer, such as a gate electrode 210, a source electrode 220, a drain electrode 230, and an active layer 240, which are not described in detail herein), a protective layer 300, a planarization layer 400 and an light-emitting element.

Figure 1B:
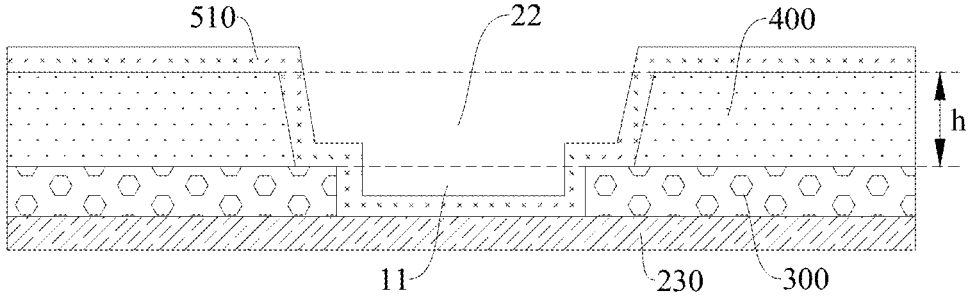
Figure 1C:
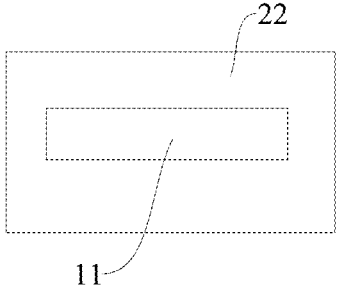
FIG. 1c shows a schematic plan view of a first through hole and a second through hole of the display backplane in FIG. 1b.
Figure 2A:
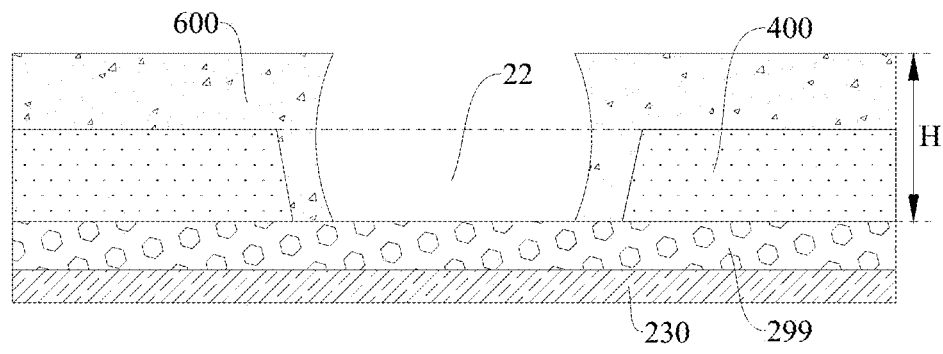
FIG. 2a and FIG. 2b show a flow chart of a process of manufacturing a display backplane in the related technologies.
Figure 2B:
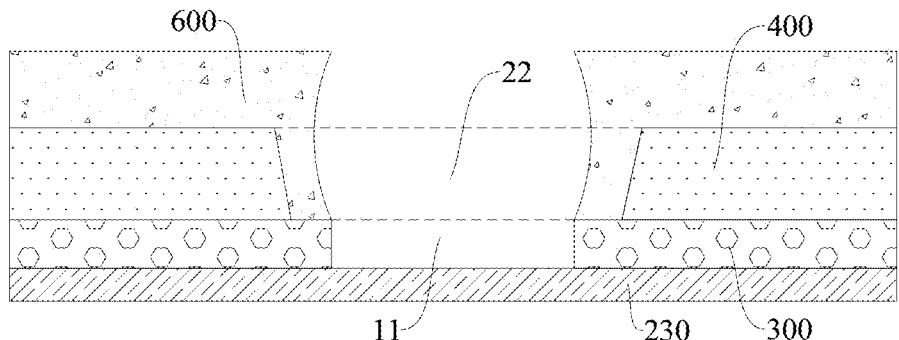
Figure 3:
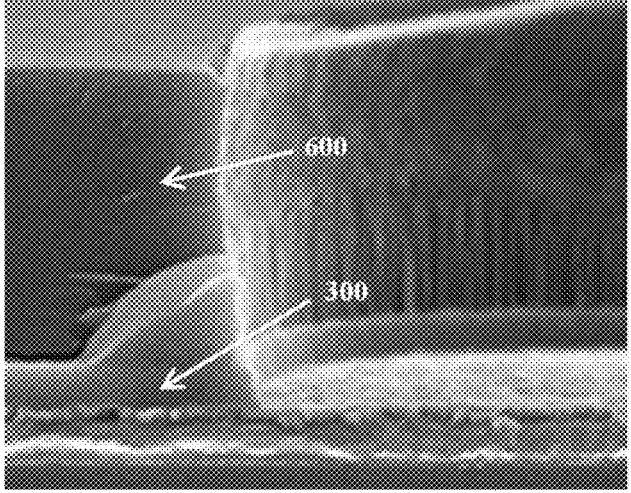
FIG. 3 shows a scanning electron micrograph of a part of a structure of the display backplane in the related technologies.

In order to show the structure of the display backplane 10 more clearly, reference is made to FIG. 1b, which is a partial enlarged view of the partial structure in the dashed circle in FIG. 1a. A thickness h of the planarization layer 400 may usually be at least 2 µm. In the display backplane, a first through hole 11 in the protective layer 300 is usually formed by a patterning process, which includes that: an entire layer of inorganic material layer 299 is formed (referring to FIG. 2a for the schematic structural diagram), and then the planarization layer 400 (which has a second through hole 22) and a patterned photoresist layer 600 are formed in sequence, where the patterned photoresist layer 600 is obtained by forming an entire layer of photoresist layer, and then performing exposure and development. However, in the above process, due to the position design of the first through hole 11 (referring to FIG. 1b and FIG. 1c), exposure and development need to be performed at a place of the entire photoresist layer where the thickness is relatively large (thickness H in the figure may generally be as high as 4 µm to 5 µm). This thickness is beyond the limit of exposure equipment in related technologies, so that after development, a slope at this place is relatively steep. Thus, in the subsequent etching process, a slope of a sidewall of the formed first through hole 11 is steep (referring to FIG. 2b and FIG. 3, it is close to 90°). Therefore, when an anode 510 of the light-emitting element in the display backplane 10 is in contact with the source electrode or drain electrode of the thin film transistor, breakage may easily occur at the contact place (referring to FIG. 1b for the schematic structural diagram). In addition, a climbing resistance at the contact place is very large, which results in overheating of the display back panel 10 during use, and even screen burn in severe cases.

In view of the above, the present disclosure is to address at least a part of the issues in the related technologies to some extent. To this end, an object of the present disclosure is to provide a solution in which exposure and development may be performed at a place of the photoresist where the thickness is relatively small when forming the first through hole of the protective layer, so as to achieve a gentle slope at the place for performing exposure and development, a relatively slow slope of the sidewall of the first through hole in the protective layer, rare occurrence of breakage between the anode of the light-emitting element and the source electrode or drain electrode of the thin film transistor array layer, infrequent overheating, and less screen burn, thereby increasing the service life of the display backplane.

Figure 4:
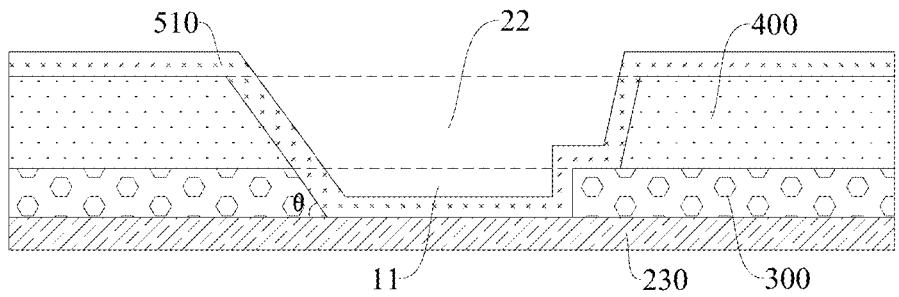
FIG. 4 shows a sectional view of a display backplane according to an embodiment of the present disclosure.

In an aspect of the present disclosure, a display backplane is provided. According to embodiments of the present disclosure, referring to FIGS. 4, 5a and 5b (it should be noted that, for ease of presentation, only a part of structures in the display backplane are shown in FIG. 4 and the following drawings, which is not repeated hereinafter), the display backplane includes a base substrate (reference may be made to FIG. 1a), a thin film transistor array layer (only a drain electrode 230 in the thin film transistor array layer is shown in the figure), a protective layer 300, a planarization layer 400, and a light-emitting element (only an anode 510 is shown in the figure) are laminated one on another in sequence on the base substrate. A first through hole 11 is formed in the protective layer 300, and a second through hole 22 is formed in the planarization layer 400. The first through hole 11 and the second through hole 22 are connected. A source electrode or a drain electrode of the thin film transistor array layer is electrically connected to the anode 510 of the light-emitting element via the first through hole 11 and the second through hole 22 (it should be noted that in the drawings of the present disclosure, a case where the anode 510 is in contact with the drain electrode 230 is taken as an example; however, those skilled in the art can understand that, it may be feasible that the anode is in contact with the source electrode, which is not repeated hereafter). Each of the first through hole and the second through hole includes a sidewall that is inclined relative to the base substrate.

According to embodiments of the present disclosure, an orthographic projection of the first through hole 11 onto the base substrate is a first orthographic projection, and an orthographic projection of the second through hole 22 onto the base substrate is a second orthographic projection. The second orthographic projection 22 covers the first orthographic projection 11, and an area of the second orthographic projection 22 is larger than an area of the first orthographic projection 11. A contour line of the second orthographic projection 22 may partially overlap a contour line of the first orthographic projection 11.

Figure 9C:
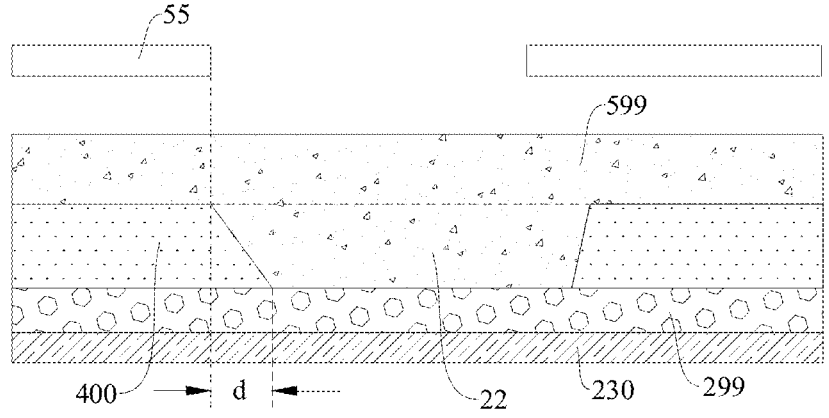

As compared with the display backplane in the related technologies, due to design change of the position of the first through hole 11 relative to the position of the second through hole 22 in the display backplane 10, exposure and development may be performed at a place of a photoresist where the thickness is relatively small when forming the first through hole 11 in the technical process for the display backplane 10 (referring to FIG. 9c for the schematic structural diagram, during exposure, an edge of a second mask 55 is located at the place of the photoresist where the thickness is relatively small). In this way, a gentle slope of a place of the patterned photoresist layer 600 for performing exposure and development is achieved (referring to FIG. 9d for the schematic structural diagram). Therefore, in the subsequent etching process, a slope of the sidewall of the first through hole 11 may be slow. Each of the first through hole and the second through hole includes the sidewall inclined with respect to the base substrate, as such, after the light-emitting element of the display backplane 10 is formed, breakage between the anode 510 of the light-emitting element and the source electrode or the drain electrode of the thin film transistor array layer may not easily occur, so that the display backplane 10 is not prone to overheating and screen burn and has a long service life.

According to embodiments of the present disclosure, with the above arrangement, an area of a cross-section of the first through hole 11 near the base substrate 10 may be enabled to be smaller than an area of a cross-section of the first through hole 11 near the planarization layer, as shown in FIG. 4.

In some embodiments, areas of cross-sections of the first through hole gradually decrease in a direction approaching the base substrate.

Thus, the sidewall of the protective layer is an inclined plane, its slope is relatively gentle, and breakage between the anode 510 of the light-emitting element and the source electrode or the drain electrode of the thin film transistor array layer may not easily occur, so that the display backplane 10 is not prone to overheating and screen burn and has a long service life.

According to embodiments of the present disclosure, further, an acute angle θ, between the sidewall of the first through hole 11 that is inclined with respect to the base substrate and a plane where the base substrate is located, ranges from 40° to 60°, as shown in FIG. 4. In some embodiments of the present disclosure, the acute angle θ may specifically be 40°, 45°, 50°, 55°, or 60°, etc.

Therefore, in a case that the sidewall of the first through hole 11 has the above structure, the slope of its longitudinal section is relatively gentle, and occurrences of breakage between the anode 510 of the light-emitting element and the source electrode or the drain electrode of the thin film transistor array layer may be fewer, and then the display backplane 10 is less prone to overheating and screen burn, thereby further increasing its service life. Moreover, the manufacturing process may be simpler on the basis of its slower slope.

Figure 5A:
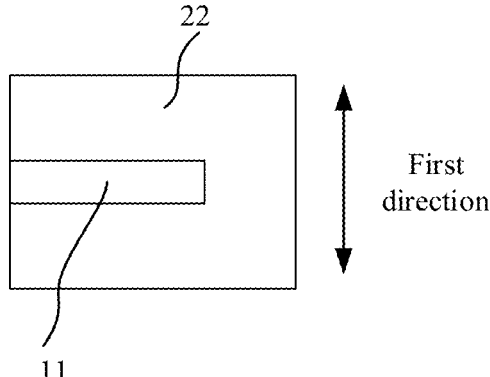
FIGS. 5a and 5b show schematic plan views of a first through hole and a second through hole of the display backplane shown in FIG. 4.
Figure 5B:
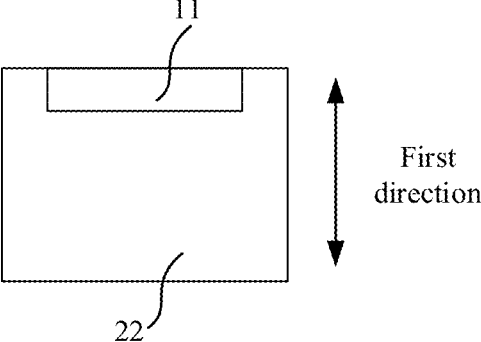
Figure 6:
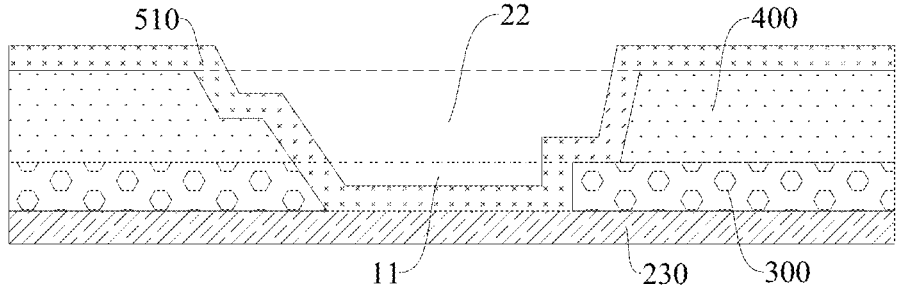
FIG. 6 shows a sectional view of a display backplane according to another embodiment of the present disclosure.

According to embodiments of the present disclosure, further, the display backplane may further include a data line connected with the source electrode or the drain electrode. Referring to FIG. 5a and FIG. 5b, each of the contour lines of the first orthographic projection of the first through hole 11 and the second orthographic projection of the second through hole 22 is a polygon (it should be noted that in FIGS. 5a and 5b, a case where the two are quadrilaterals is taken as an example for illustration; those skilled in the art can understand that the first orthographic projection and the second orthographic projection may be other shapes, such as triangle, quadrilateral, or pentagon; in addition, the shape of the first orthographic projection and the shape of the second orthographic projection may be the same or may be different, as long as the contour lines thereof may overlap partially, which is not described in detail herein). A part where the contour lines of the first orthographic projection and the second orthographic projection are overlapped is an edge of the polygon. An extension direction of the part where the contour lines are overlapped is the same as an extension direction of the data line (referring to FIG. 5a for the schematic structural diagram, in which a first direction is the extension direction in of the data line, the data line not being shown in the figure), or, an extension direction of the part where the contour lines are overlapped is perpendicular to an extension direction of the data line (referring to FIG. 5b for the schematic structural diagram).

Therefore, the arrangement of the first through hole 11 and the second through hole 22 in the display backplane 10 is flexible, which is easy for industrialization.

According to embodiments of the present disclosure, further, the sidewall of the second through hole 22 that is inclined relative to the base substrate has a step-like structure.

The planarization layer 400 has the step-like structure at the second through hole 22. Therefore, the manufacturing process of the display backplane 10 is relatively simple. Specifically, when forming the first through hole 11 in the protective layer 300, processes such as an etching process may be directly performed. As a result, it is easy for industrial production.

Figure 7:
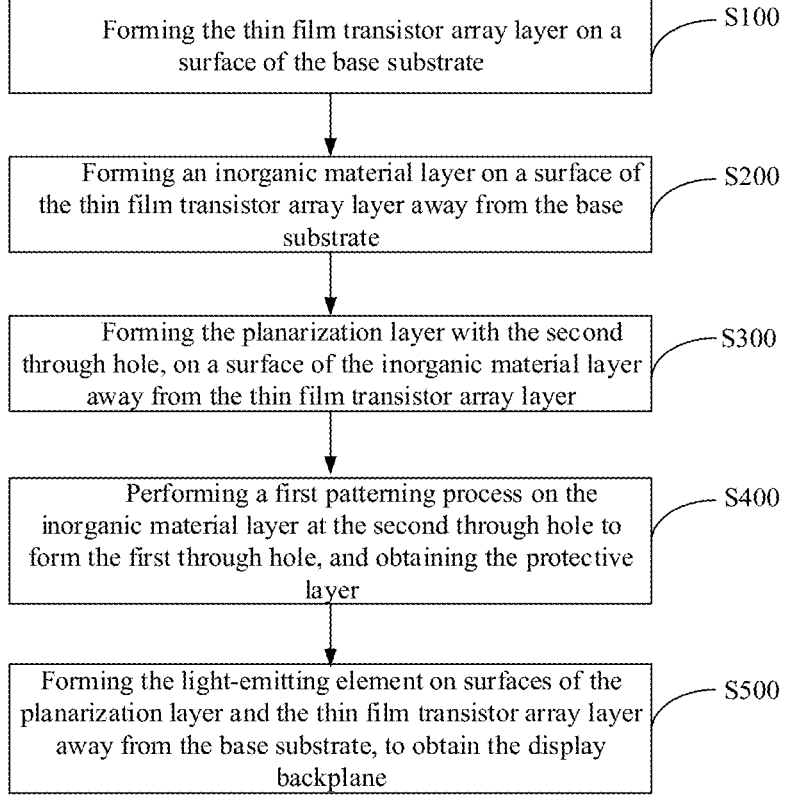
FIG. 7 shows a flow chart of a method for manufacturing a display backplane according to an embodiment of the present disclosure.

In another aspect of the present disclosure, a method for manufacturing the above display backplane is provided. According to embodiments of the present disclosure, referring to FIG. 7, the method may include the following steps.

Step S100 includes: forming the thin film transistor array layer on a surface of the base substrate.

According to embodiments of the present disclosure, the specific process of forming the thin film transistor array layer on the surface of the base substrate may be a conventional process of forming a thin film transistor array layer in the related technologies. For example, when forming the gate electrode, the source electrode, and the drain electrode, processes such as a deposition process, a patterning process or an etching process, may be adopted. When forming the active layer, an ion implantation process used may be adopted, and all processing parameters thereof may be conventional processing parameters, which are not described in detail herein. Therefore, the manufacturing process is simple and convenient, which is easy to implement and easy to be put into industrialized production.

Step S200 includes: forming an inorganic material layer 299 on a surface of the thin film transistor array layer away from the base substrate (reference is made to FIG. 9a for the schematic structural diagram; it should be noted that only a part of the structure is shown in the figure, i.e., a part of the inorganic material layer 299 on the drain electrode 230 in the thin film transistor array layer is shown in the figure, which is not repeated hereinafter).

According to embodiments of the present disclosure, the specific process for forming the inorganic material layer 299 on the surface of the thin film transistor array layer away from the base substrate may include a deposition technique, for example, a chemical vapor deposition technique, and all processing parameters thereof may be conventional processing parameters, which is not described in detail herein. In addition, a thickness of the inorganic material layer 299 may range from 200 nm to 500 nm, and its material may be silicon dioxide or silicon nitride, etc. Therefore, the manufacturing process is simple and convenient, which is easy to implement and easy to be put into industrialized production.

Step S300 includes: forming the planarization layer 400 with the second through hole 22, on a surface of the inorganic material layer 299 away from the thin film transistor array layer (referring to FIG. 9b for the schematic structural diagram).

According to embodiments of the present disclosure, the specific process for forming the planarization layer 400 with the second through holes 22 on the surface of the inorganic material layer 299 away from the thin film transistor array layer may be a conventional process, and all processing parameters thereof may be conventional processing parameters, which is not described in detail herein. Therefore, the manufacturing process is simple and convenient, which is easy to implement and easy to be put into industrialized production.

For example, the forming the planarization layer with the second through hole on the surface of the inorganic material layer away from the thin film transistor array layer in step S300 includes: forming a first photoresist layer on the surface of the inorganic material layer away from the thin film transistor array layer; and performing a second patterning process on the first photoresist layer by using a first mask, to obtain the planarization layer with the second through hole.

Step S400 includes: performing a first patterning process on the inorganic material layer at the second through hole to form the first through hole, and obtaining the protective layer.

According to embodiments of the present disclosure, further, as shown in FIG. 8, the performing the first patterning process on the inorganic material layer at the second through hole to form the first through hole may include the following steps.

Step S410 includes: forming a second photoresist layer 599 on the surface of the planarization layer 400 away from the thin film transistor array layer, where the second photoresist layer 599 covers the planarization layer 400 and the second through hole 22 is filled with the second photoresist layer (referring to FIG. 9c for the schematic structural diagram).

According to embodiments of the present disclosure, the specific process of forming the second photoresist layer 599 on the surface of the planarization layer 400 away from the thin film transistor array layer may be a conventional process, and all processing parameters thereof may be conventional processing parameters, which is not described in detail herein. Therefore, the manufacturing process is simple and convenient, which is easy to implement and easy to be put into industrialized production.

Figure 9D:
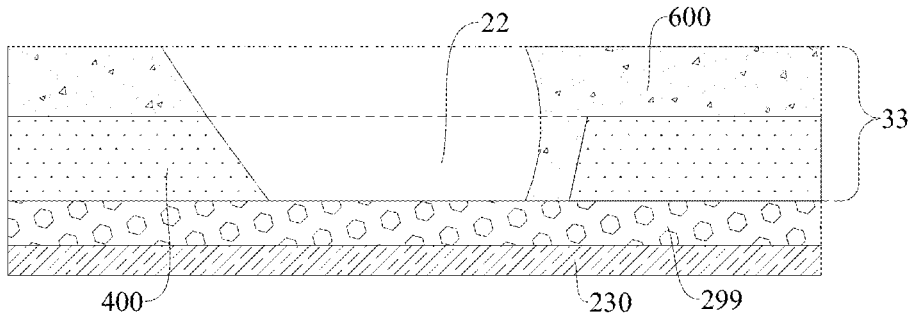

Step S420 includes: performing a third patterning process on the second photoresist layer 599 by using a second mask 55, to form a third through hole 33 in the second photoresist layer and expose a part of a surface of the planarization layer 400 (referring to FIG. 9c and FIG. 9d for the schematic structural diagram).

According to the embodiments of the present disclosure, due to design change of the position of the first through hole 11 relative to the position of the second through hole 22 in the display backplane 10 of the present disclosure, exposure and development may be performed at a place of the photoresist where the thickness is relatively small, when performing the third patterning process on the second photoresist layer 599 with the second mask 55 (referring to FIG. 9c for the schematic structural diagram, during exposure, an edge of the second mask 55 is located at the place of the photoresist where the thickness is relatively small). In this way, a gentle slope of a place of the patterned photoresist layer 600 for performing exposure and development is achieved (referring to FIG. 9d for the schematic structural diagram). Therefore, in the subsequent etching process, a slope of the sidewall of the first through hole 11 may be slow. As such, after the light-emitting element of the display backplane 10 is formed, breakage between the anode 510 of the light-emitting element and the source electrode or the drain electrode of the thin film transistor array layer may not easily occur, so that the display backplane 10 is not prone to overheating and screen burn and has a long service life.

Figure 11A:
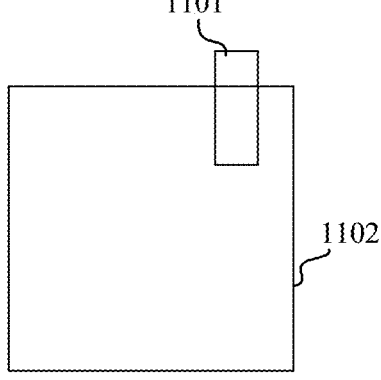
FIG. 11a and FIG. 11b show a positional relationship between a first opening in a first mask and a second opening in a second mask according to an embodiment of the present disclosure.
Figure 11B:
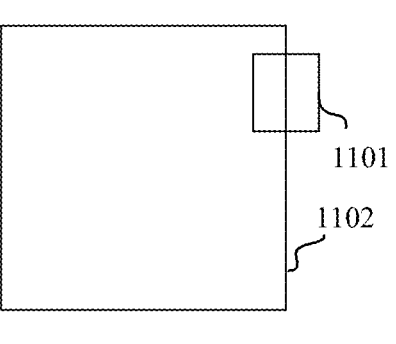

According to embodiments of the present disclosure, further, as shown in FIGS. 11a and 11b, a part of an orthographic projection of a second opening 1101 in the second mask 55 onto the base substrate may be outside an orthographic projection of a first opening 1102 in the first mask onto the base substrate; and a distance d, from an edge of the orthographic projection of the second opening 1101 onto the base substrate, to an edge of the orthographic projection of the first opening 1102 onto the base substrate, may range from 1.5 μm to 2.0 μm, where the edge of the orthographic projection of the second opening is outside the orthographic projection of the first opening.

As shown in FIGS. 11a and 11b, the first opening 1102 may not completely cover the second opening 1101 in various directions.

In some embodiments of the present disclosure, the distance d may specifically be 1.5 μm, 1.6 μm, 1.7 μm, 1.8 μm, 1.9 μm, 2.0 μm, or the like. The above distance is relatively appropriate, which may further make the slope of the sidewall of the first through hole 11 slower.

Based on the design in which the second opening in the second mask is not completely cover the first opening in the first mask, exposure and development may be performed at a place of the photoresist where the thickness is relatively small, when performing the third patterning process on the second photoresist layer 599 by using the second mask 55 (referring to FIG. 9c for the schematic structural diagram, during exposure, an edge of the second mask 55 is located at the place of the photoresist where the thickness is relatively small). In this way, a gentle slope of a place of the patterned photoresist layer 600 for performing exposure and development is achieved (referring to FIG. 9d for the schematic structural diagram). Therefore, in the subsequent etching process, a slope of the sidewall of the first through hole 11 may be slow. As such, after the light-emitting element of the display backplane 10 is formed, breakage between the anode 510 of the light-emitting element and the source electrode or the drain electrode of the thin film transistor array layer may not easily occur, so that the display backplane 10 is not prone to overheating and screen burn and has a long service life.

Figure 9E:
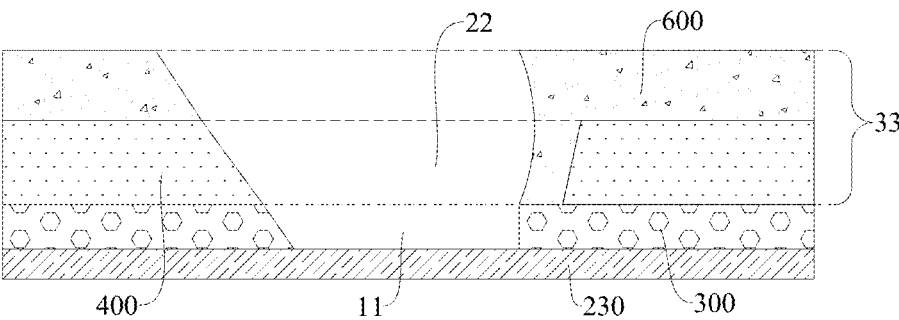
Figure 9F:
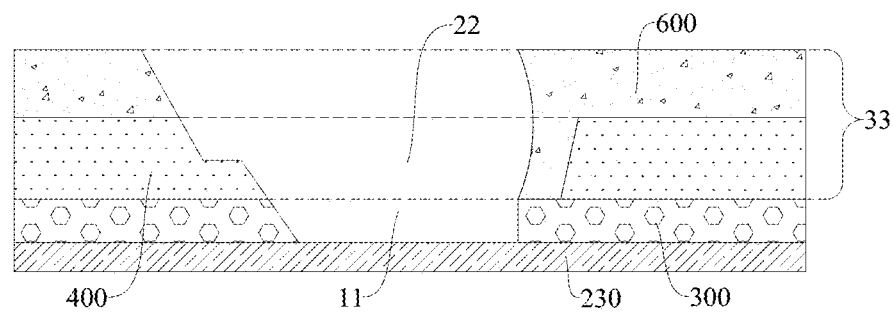
Figure 10:
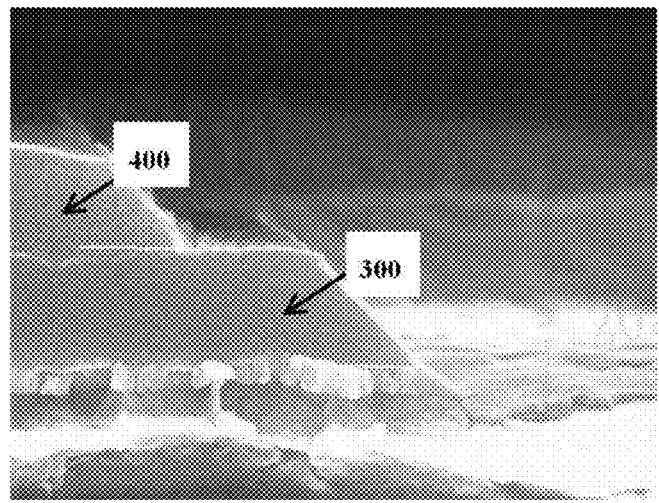
FIG. 10 shows a scanning electron micrograph of a part of a structure in FIG. 9e.

Step S430 includes: etching the inorganic material layer 299 to form the first through hole 11 so as to obtain the protective layer 300 (referring to FIG. 9e for the structural schematic diagram. In a specific embodiment of the present disclosure, reference can be made to be made to FIG. 10 for a scanning electron micrograph of the formed protective layer 300).

According to embodiments of the present disclosure, the specific process of etching the exposed planarization layer 400 and the inorganic material layer 299 may include dry etching, and processing parameters of the dry etching may be conventional processing parameters, which is not described in detail herein. As a result, the manufacturing process is simple and convenient, which is easy to implement and easy to be put into industrialized production; and it is beneficial to obtain the protective layer 300 in which the sidewall of the first through hole 11 has a slow slope.

In some embodiments, the method further includes etching the exposed planarization layer 400 to form a step-like structure at the second through hole of the planarization layer.

During the etching process, the third through hole 33 is formed in the second photoresist layer, and a part of the surface of the planarization layer 400 facing the second photoresist layer is exposed. When the first through hole 11 is formed, the step-like structure is formed at the second through hole 22 of the planarization layer 400.

Therefore, the manufacturing process of the display backplane 10 is relatively simple and easy for industrial production.

Step S500 includes: forming the light-emitting element on surfaces of the planarization layer and the thin film transistor array layer away from the base substrate, to obtain the display backplane.

According to embodiments of the present disclosure, the specific process for forming light-emitting element on the surfaces of the planarization layer and the thin film transistor array layer away from the base substrate may be a conventional process for forming an light-emitting element in the related technologies, and all its processing parameters may be conventional processing parameters, which is not described in detail herein. Therefore, the manufacturing process is simple and convenient, which is easy to implement and easy to be put into industrialized production.

In yet another aspect of the present disclosure, a display device is provided. According to embodiments of the present disclosure, the display device includes the display backplane as described above. The display device is not prone to overheating and screen burn and has a long service life. The display device may have all the features and advantages of the display backplane described above, which are not repeated herein.

According to embodiments of the present disclosure, the display device may include other required structures and components, in addition to the display backplane described above. Those skilled in the art may supplement and design according to a specific type and use requirements of the display device, which are not described in detail herein.

According to embodiments of the present disclosure, the specific type of the display device is not specifically limited, and it may include, but is not limited to, a mobile phone, a tablet computer, a wearable device, a game console, a television, or a car display, etc.

In the descriptions of the present disclosure, it should be understood that the terms such as "first" and "second" are merely used for descriptive purposes, and cannot be understood as indicating or implying relative importance or implicitly indicating the number of indicated technical features. Therefore, a feature defined with "first" or "second" may explicitly or implicitly includes at least one of the feature. In the descriptions of the present disclosure, the term of "multiple" means two or more than two, unless otherwise specifically defined.

In the present disclosure, unless otherwise specifically stipulated and define, a first feature being "on" or "under" a second feature may be that the first feature is in direct contact with the and second feature, or that the first feature is in indirect contact with the and second feature through an intermediary. Moreover, the first feature being "above", "on" or "over" the second feature may mean that the first feature is right above or obliquely above the second feature, or it simply means that a level of the first feature is higher than a level of the second feature. The first feature being "below", "under" or "beneath" the second feature may represent that the first feature is right below or obliquely below the second feature, or it simply represents that the level of the first feature is lower than the level of the second feature.

In the descriptions of this specification, descriptions with reference to the terms such as "an embodiment", "some embodiments", "examples", "specific examples", or "some examples" mean that specific features, structures, materials, or characteristics described in conjunction with the embodiment(s) or example(s) are included in at least one embodiment or example of the present disclosure. In this specification, the illustrative representations of the above terms do not necessarily refer to the same embodiments or examples. Moreover, the specific features, structures, materials, or characteristics as described may be combined in any one or more embodiments or examples in an appropriate manner. In addition, without contradicting each other, those skilled in the art may join and combine different embodiments or examples and features of the different embodiments or examples described in this specification.

Although the embodiments of the present disclosure are illustrated and described in the above, it can be understood that the above embodiments are illustrative and should not be construed as limiting the present disclosure. Changes, modifications, substitutions and variations of the above embodiments may be made by those of ordinary shill in the art within the scope of the present disclosure.

What is claimed is:

1. A display backplane, comprising a base substrate, wherein a thin film transistor array layer, a protective layer, a planarization layer and a light-emitting element are laminated one on another in sequence on the base substrate;

wherein the protective layer is configured to cover a source electrode or a drain electrode of the thin film transistor array layer;

wherein a first through hole is formed in the protective layer, and the first through hole is used to expose the source electrode or the drain electrode; a second through hole is formed in the planarization layer, and the first through hole and the second through hole are connected;

wherein the source electrode or the drain electrode of the thin film transistor array layer is electrically connected to an anode of the light-emitting element via the first through hole and the second through hole;

wherein each of the first through hole and the second through hole comprises a sidewall that is inclined with respect to the base substrate;

wherein a thickness of the planarization layer is at least 2 μm;

wherein the planarization layer has two opposite sidewalls along a cross-section that are inclined with respect to the base substrate, one of two opposite sidewalls of the planarization layer has a step-like structure at the second through hole, and the other of the two opposite sidewalls of the planarization layer does not have a step-like structure at the second through hole;

the step-like structure of the planarization layer comprises a first sidewall, a second sidewall and a connecting member connecting the first sidewall and the second sidewall, and materials of the first sidewall, the second sidewall and the connecting member are the same; the first sidewall and a third sidewall of the first through hole that is inclined with respect to the base substrate are coplanar, and the other of the two opposite sidewalls of the planarization layer is not coplanar with another sidewall opposite to the third sidewall of the first through hole;

the planarization layer comprises a first plane and a second plane that are parallel to a third plane where base substrate is located, the first plane and the second plane are opposite to each other, the first plane is adjacent to the protective layer, the second plane is adjacent to the light-emitting element, and one of a height from the first plane to the connecting member and a height from the connecting member to the second plane is greater than a thickness of the protective layer.

2. The display backplane according to claim 1, wherein an orthographic projection of the first through hole onto the base substrate is a first orthographic projection, an orthographic projection of the second through hole onto the base substrate is a second orthographic projection, the second orthographic projection covers the first orthographic projection, an area of the second orthographic projection is larger than an area of the first orthographic projection, and a contour line of the second orthographic projection partially overlaps a contour line of the first orthographic projection.

3. The display backplane according to claim 1, wherein an area of a cross-section of the first through hole near the base substrate is smaller than an area of a cross-section of the first through hole near the planarization layer.

4. The display backplane according to claim 3, wherein areas of cross-sections of the first through hole gradually decrease in a direction approaching the base substrate.

5. The display backplane according to claim 1, wherein an acute angle, between the sidewall of the first through hole that is inclined with respect to the base substrate and a plane where the base substrate is located, ranges from 40° to 60°.

6. The display backplane according to claim 2, further comprising a data line connected with the source electrode or the drain electrode;

wherein each of the contour lines of the first orthographic projection and the second orthographic projection is a polygon, and a part where the contour lines of the first orthographic projection and the second orthographic projection are overlapped is an edge of the polygon;

wherein an extension direction of the part where the contour lines are overlapped is the same as an extension direction of the data line, or, an extension direction of the part where the contour lines are overlapped is perpendicular to an extension direction of the data line.

7. A method for manufacturing the display backplane according to claim 1, comprising:

forming the thin film transistor array layer on a surface of the base substrate;

forming an inorganic material layer on a surface of the thin film transistor array layer away from the base substrate;

forming the planarization layer with the second through hole, on a surface of the inorganic material layer away from the thin film transistor array layer;

performing a first patterning process on the inorganic material layer at the second through hole to form the first through hole, and obtaining the protective layer; and forming the light-emitting element on surfaces of the planarization layer and the thin film transistor array layer away from the base substrate, to obtain the display backplane;

wherein the forming the planarization layer with the second through hole on the surface of the inorganic material layer away from the thin film transistor array layer comprises:

forming a first photoresist layer on the surface of the inorganic material layer away from the thin film transistor array layer; and performing a second patterning process on the first photoresist layer by using a first mask, to obtain the planarization layer with the second through hole;

wherein the performing the first patterning process on the inorganic material layer at the second through hole to form the first through hole comprises:

forming a second photoresist layer on the surface of the planarization layer away from the thin film transistor array layer, wherein the second photoresist layer covers the planarization layer and the second through hole is filled with the second photoresist layer;

performing a third patterning process on the second photoresist layer by using a second mask, to form a third through hole in the second photoresist layer and expose a part of a surface of the planarization layer; and etching the inorganic material layer to form the first through hole so as to obtain the protective layer;

wherein the method further comprises: etching the exposed planarization layer to form the step- like structure at the second through hole of the planarization layer.

8. The method according to claim 7, wherein a part of an orthographic projection of a second opening in the second mask onto the base substrate is outside an orthographic projection of a first opening in the first mask onto the base substrate;

wherein a distance, from an edge of the orthographic projection of the second opening onto the base substrate, to an edge of the orthographic projection of the first opening onto the base substrate, ranges from 1.5 µm to 2.0 µm, wherein the edge of the orthographic projection of the second opening is outside the orthographic projection of the first opening.

9. The method according to claim 7, wherein a process for etching the inorganic material layer comprises dry etching.

10. A display device, comprising a display backplane, wherein the display backplane comprises a base substrate, a thin film transistor array layer, a protective layer, a planarization layer, and a light-emitting element are laminated one on another in sequence on the base substrate; wherein the protective layer is configured to cover a source electrode or a drain electrode of the thin film transistor array layer;

wherein a first through hole is formed in the protective layer, and the first through hole is used to expose the source electrode or the drain electrode; a second through hole is formed in the planarization layer, and the first through hole and the second through hole are connected;

wherein the source electrode or the drain electrode of the thin film transistor array layer is electrically connected to an anode of the light-emitting element via the first through hole and the second through hole;

wherein each of the first through hole and the second through hole comprises a sidewall that is inclined with respect to the base substrate;

wherein a thickness of the planarization layer is at least 2 µm;

wherein the planarization layer has two opposite sidewalls along a cross-section that are inclined with respect to the base substrate, one of two opposite sidewalls of the planarization layer has a step-like structure at the second through hole, and the other of the two opposite sidewalls of the planarization layer does not have a step-like structure at the second through hole;

the step-like structure of the planarization layer comprises a first sidewall, a second sidewall and a connecting member connecting the first sidewall and the second sidewall, and materials of the first sidewall, the second sidewall and the connecting member are the same; the first sidewall and a third sidewall of the first through hole that is inclined with respect to the base substrate are coplanar, and the other of the two opposite sidewalls of the planarization layer is not coplanar with another sidewall opposite to the third sidewall of the first through hole;

the planarization layer comprises a first plane and a second plane that are parallel to a third plane where base substrate is located, the first plane and the second plane are opposite to each other, the first plane is adjacent to the protective layer, the second plane is adjacent to the light-emitting element, and one of a height from the first plane to the connecting member and a height from the connecting member to the second plane is greater than a thickness of the protective layer.

11. The display device according to claim 10, wherein an orthographic projection of the first through hole onto the base substrate is a first orthographic projection, an orthographic projection of the second through hole onto the base substrate is a second orthographic projection, the second orthographic projection covers the first orthographic projection, an area of the second orthographic projection is larger than an area of the first orthographic projection, and a contour line of the second orthographic projection partially overlaps a contour line of the first orthographic projection.

12. The display device according to claim 10, wherein areas of cross-sections of the first through hole gradually decrease in a direction approaching the base substrate.

13. The display device according to claim 10, wherein an acute angle, between the sidewall of the first through hole that is inclined with respect to the base substrate and a plane where the base substrate is located, ranges from 40° to 60°.

14. The display device according to claim 11, wherein the display backplane further comprises a data line connected with the source electrode or the drain electrode;

wherein each of the contour lines of the first orthographic projection and the second orthographic projection is a polygon, and a part where the contour lines of the first orthographic projection and the second orthographic projection are overlapped is an edge of the polygon;

wherein an extension direction of the part where the contour lines are overlapped is the same as an extension direction of the data line, or, an extension direction of the part where the contour lines are overlapped is perpendicular to an extension direction of the data line.

15. The display backplane according to claim 1, wherein an acute angle, between the one of two opposite sidewalls of the planarization layer that has a step-like structure at the second through hole and the third plane, ranges from 40° to 60°.

* * * * *